United States Patent [19]

Kim

[11] Patent Number: 5,702,974
[45] Date of Patent: Dec. 30, 1997

[54] METHOD FOR FABRICATING CAPACITOR OF SEMICONDUCTOR DEVICE

[75] Inventor: Jeong Ho Kim, Kyoungki-do, Rep. of Korea

[73] Assignee: Hyundai Electronics Industries Co., Ltd., Kyoungki-do, Rep. of Korea

[21] Appl. No.: 790,863

[22] Filed: Feb. 3, 1997

Related U.S. Application Data

[63] Continuation of Ser. No. 503,497, Jul. 18, 1995, abandoned.

[30] Foreign Application Priority Data

Jul. 18, 1994 [KR] Rep. of Korea ............... 94-17301

[51] Int. Cl.⁶ .................................................. H01L 21/70
[52] U.S. Cl. ........................... 437/60; 437/919; 437/52
[58] Field of Search ............................ 437/60, 919, 52, 437/228.6, 228.5, 228 HEM, 41 RMM, 978, DIG. 14, DIG. 51; 257/309

[56] References Cited

U.S. PATENT DOCUMENTS

| | | | |
|---|---|---|---|
| 5,164,337 | 11/1992 | Ogawa et al. | 437/919 |
| 5,330,928 | 7/1994 | Tseng | 437/60 |
| 5,416,037 | 5/1995 | Sato et al. | 437/52 |
| 5,422,295 | 6/1995 | Choi et al. | 437/60 |
| 5,432,116 | 7/1995 | Keum et al. | 437/60 |
| 5,436,186 | 7/1995 | Hsue et al. | 437/60 |
| 5,436,187 | 7/1995 | Tanigawa | 437/60 |
| 5,436,188 | 7/1995 | Chen | 437/60 |
| 5,438,010 | 8/1995 | Saeki | 437/60 |
| 5,460,999 | 10/1995 | Hong et al. | 437/60 |
| 5,478,770 | 12/1995 | Kim | 437/60 |
| 5,480,826 | 1/1996 | Sugahara et al. | 437/60 |
| 5,534,457 | 7/1996 | Tseng et al. | 437/52 |
| 5,573,967 | 11/1996 | Tseng | 437/52 |

*Primary Examiner*—Jey Tsai
*Assistant Examiner*—S. Mulpuri
*Attorney, Agent, or Firm*—Reid & Priest L.L.P.

[57] ABSTRACT

A method for fabricating a capacitor of a semiconductor device. The capacity of the capacitor is increased through enlargement of the surface area of storage electrode by providing a plurality of side walls which are of prominence and depression to a cylindrical storage electrode such that it can significantly contribute to the high integration of semiconductor devices.

6 Claims, 2 Drawing Sheets

METHOD FOR FABRICATING CAPACITOR OF SEMICONDUCTOR DEVICE

This is a continuation of U.S. application Ser. No. 08/503,497 filed Jul. 18, 1995 abandoned.

BACKGROUND OF THE INVENTION

1. Field of the Invention

The present invention relates, in general, to a method for frabricating a capacitor of a semiconductor device and, more particularly, to an improvement in the capacity of a capacitor along with the method.

2. Description of the Prior Art

Since cells are generally reduced in size with high integration of semiconductor devices, it is difficult to secure enough capacity proportional to the surface area of storage electrodes. In particular, for DRAM devices, each consisting of one MOS transistor and one capacitor, it is one of the most important points to the high integration thereof to reduce the area occupied by the capacitor yet increase its capacity.

Various attempts have been made to increase the capacity of capacitors, including use of a dielectric material with a high dielectric constant, reduction of dielectric film in thickness, or increasing capacitor surface area. However, such conventional methods all are problematic. Dielectric materials with high dielectric constant, such as $Ta_2O_5$, $TiO_2$ or $SrTiO_3$, are difficult to apply in devices in practice because their reliability and thin film characteristics are not certainly verified. Dielectric film that is too thin is more likely to be broken upon operation, seriously affecting the reliability of the capacitor. For increasing the surface area of a capacitor, a fin structure has been suggested in which polysilicon multilayers are interconnected by a conductive material going through them, a labyrinthian structure with a cylindrical or rectangular shape and a structure having a hemispherical grain of silicon on a storage electrode. However, the security of sufficient capacity in such structures is still unsolved as the capacitor is reduced in area according to the high integration of DRAM.

In order to better understand the background of the invention, a description of a conventional cylindrical capacitor is given below.

First, predetermined infrastructures including an element isolating film, a MOSFET and a bit line in contact with a drain electrode are formed on a semiconductor substrate, followed by the coating of a planarization layer, e.g. an insulating film pattern having a storage electrode contact hole through which a source electrode is exposed.

Thereafter, a first conductive layer is deposited to fill the storage electrode contact hole on which a sacrificial pattern is, then, formed. On the resulting structure is formed a second conductive layer, which is subjected to anisotropic etch and then the sacrificial film pattern is removed, to form a cylindrical storage electrode consisting of the first and the second conductive layers.

Such a conventional cylindrical capacitor has an advantage over a cavity-type capacitor in topology but is still problematic in securing sufficient capacity in response to the high integration of semiconductor devices.

SUMMARY OF THE INVENTION

Accordingly, it is an object of the present invention to overcome the above problems encountered in the prior art and to provide a method for fabricating a capacitor of a semiconductor device which is able to increase the capacity through the enlargement of the surface area of a storage electrode.

In accordance with the present invention, the above object of the present invention could be accomplished by providing a method for fabricating a capacitor of a semiconductor device, comprising the steps of: forming a lower insulating layer on a semiconductor substrate; forming a contact hole in the lower insulating layer by use of a contact mask, said semiconductor substrate being partially exposed through said contact hole; forming an insulating film spacer at the side wall of the contact hole; depositing a first conductive layer over the resulting structure, said first conductive layer being partially contacted through the contact hole; sequentially depositing first, second and third sacrificial films over the first conductive layer; subjecting the third, the second and the first sacrificial films to etch under a storage electrode mask; laterally etching the second sacrificial film to a predetermined thickness; depositing a second conductive layer to a predetermined thickness over the resulting structure; subjecting the second conductive layer to anisotropic etch, to form a second conductive layer spacer; depositing an oxide film to a predetermined thickness over the resulting structure; anisotropically overetching the oxide film to form an oxide film spacer and a first conductive layer pattern; depositing a third conductive layer to some thickness over the resulting structure; subjecting the third conductive layer to anisotropic etch, to form a third conductive layer spacer; and removing the first, the second and the third sacrificial film and the oxide film spacer by wet etch, to form a cylindrical storage electrode having side walls which are of prominence and depression.

BRIEF DESCRIPTION OF THE DRAWINGS

The above object and other advantages of the present invention will become more apparent by describing in detail the preferred embodiments of the present invention with reference to the attached drawings in which.

DETAILED DESCRIPTION OF THE INVENTION

The application of the preferred embodiment of the present invention is best understood with reference to the accompanying drawings.

Preferred process steps of fabricating a capacitor of semiconductor device are described in conjunction with FIGS. 1 through 6.

Figure 1:
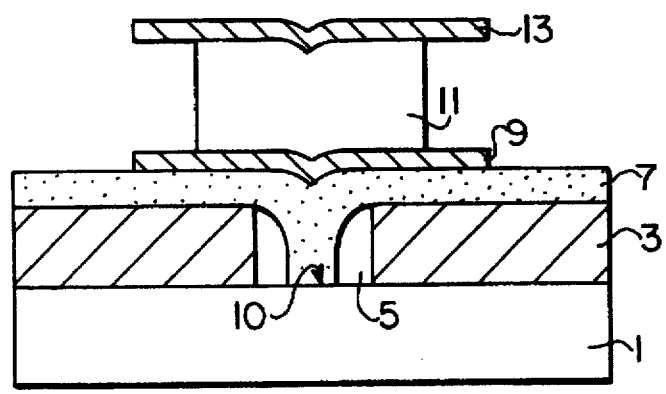
FIGS. 1 through 6 are schematic cross sectional views showing a method for fabricating a capacitor of a semiconductor device, according to the present invention.

As shown in FIG. 1, a lower insulating layer 3 is formed on a semiconductor substrate 1 and then, etched under a contact hole mask to form a contact hole 10 which exposes a predetermined area of the semiconductor substrate 1. Then, an insulating film spacer 5 is formed at the side wall of the contact hole 10. Following this, a first conductive layer 7 is deposited which is in contact with the semiconductor through the contact hole 10. First second and third sacrificial films 9, 11 and 13 are sequentially formed over the first conductive layer 7 and etched by use of a storage electrode mask (not shown), in reverse order. Thereafter, taking advantage of difference in etch selection ratio between the second sacrificial film 11 and the other sacrificial films 9 and 13, the second sacrificial film 11 is laterally etched to some thickness. The difference in etch selection ratio may come from different materials, for example, tetra ethyl ortho silicate (hereinafter referred to as "TEOS") for the first and the third sacrificial films 9 and 13 and $O_3$-phospho silicate glass (hereinafter referred to as "$O_3$-

PSG") for the second sacrificial film 11. The etch selection ratio of TEOS to O₃-PSG is more than 10. The lateral etch of the second sacrificial film 11 is effected by use of buffered oxide etchant (hereinafter referred to as "BOE") of 50:1.

Figure 2:
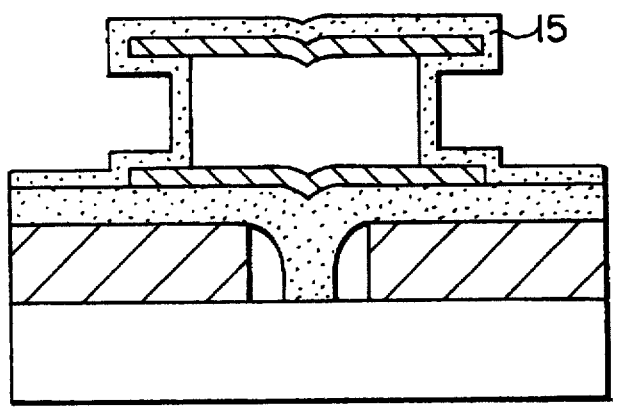

FIG. 2 is a cross section after a second conductive layer 15 with a constant thickness is formed over the resulting structure of FIG. 1. The second conductive layer 15 is formed of polysilicon.

Figure 3:
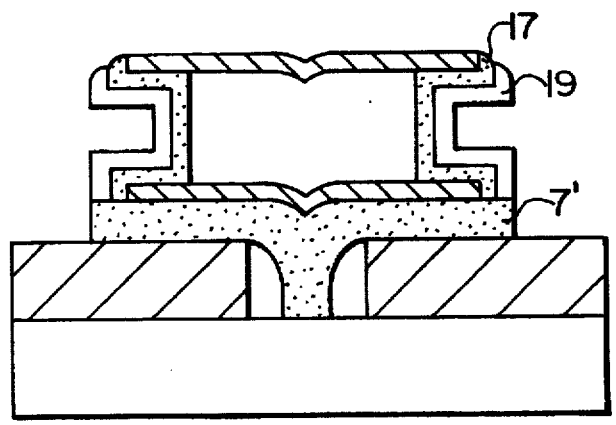

FIG. 3 is a cross section after the second conductive layer 15 is subjected to anisotropic etch, to form a second conductive layer spacer 17 at the side wall of the first, second and third sacrificial films etched, followed by the formation of an oxide film spacer 19 at the side wall of the second conductive layer spacer 17. The oxide film spacer 19 may be formed by depositing an oxide film to some thickness over the resulting structure comprising the second conductive layer spacer 17 and subjecting the oxide film to anisotropic etch. Upon anisotropic etch, a first conductive layer pattern 7' is formed owing to overetch.

Figure 4:
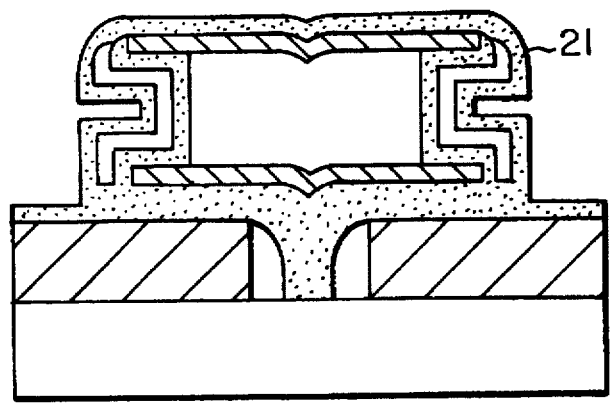

FIG. 4 is a cross section after a third conductive layer 21, formed of polysilicon, is deposited to some thickness over the resulting structure.

Figure 5:
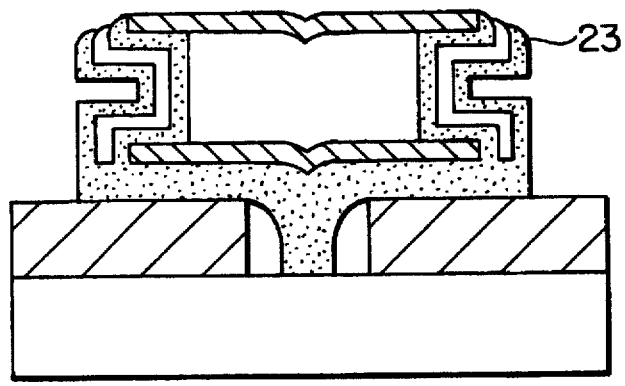

FIG. 5 is a cross section after a third conductive layer spacer 23 is formed by anisotropic etch.

Figure 6:
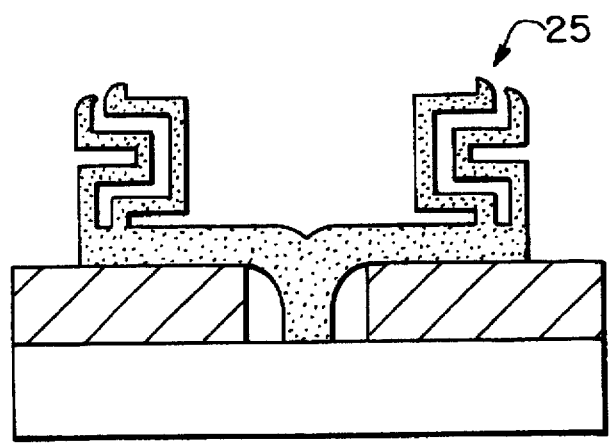

FIG. 6 is a cross section after a wet etch process is undertaken to remove the first, the second and the third sacrificial film 9, 11 and 13 and the oxide film spacer 23, thereby forming a cylindrical storage electrode. A BOE of 9:1 is used for the wet etch. As shown in this figure, the cylindrical storage electrode 25 comprises two side walls which are of prominence and depression. Additional oxide film spacers and conductive layer spacers may be further formed, which results in a plurality of the side walls of the cylindrical storage electrode 25, thereby increasing the capacity of a capacitor.

As described hereinbefore, the capacity of a capacitor can be increased by giving a plurality of side walls which are of prominence and depression to a cylindrical storage electrode, thereby contributing to the high integration of semiconductor devices.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for fabricating a capacitor of a semiconductor device, comprising the steps of:

forming a lower insulating layer on a semiconductor substrate;

forming a contact hole in the lower insulating layer by use of a contact mask so that the semiconductor substrate is partially exposed through the contact hole;

forming an insulating film spacer at the side wall of the contact hole;

depositing a first conductive layer over the resulting structure, the first conductive layer being partially contacted through the contact hole;

sequentially depositing first, second and third sacrificial films over the first conductive layer, wherein the second sacrificial film has a higher etch rate compared to the first and third sacrificial films;

subjecting the third, the second and first sacrificial films to etch under a storage electrode mask;

laterally etching the second sacrificial film so that the second sacrificial film has a width less than that of the first and third sacrificial films;

depositing a second conductive layer over the resulting structure so that the second conductive layer includes a groove formed by the width difference between the second sacrificial film and the first and third sacrificial films;

subjecting the second conductive layer to anisotropic etch, to form a second conductive layer spacer having a groove corresponding to the groove in the second conductive layer;

depositing an oxide film over the structure resulting from said step of subjecting the second conductive layer to anisotropic etch, so that the oxide film includes a groove corresponding to the groove in the second conductive spacer;

anisotropically overetching the oxide film and etching a portion of the first conductive layer to form an oxide film spacer having a groove corresponding to the groove in the oxide film and a first conductive layer pattern;

depositing a third conductive layer over the structure resulting from said step of anisotropically overetching the oxide film and etching a portion of the first conductive layer, so that the third conductive layer includes a groove corresponding to the groove in the oxide film spacer, subjecting the third conductive layer to anisotropic etch, to form a third conductive layer spacer having a groove corresponding to the groove in the oxide film spacer; and removing the first, second and third sacrificial films and the oxide film spacer by wet etch so that the second and third conductive layer spacers are spaced apart, to form a cylindrical storage electrode having sidewalls with an increased surface area provided by the space between the second and third conductive layer spacers and the grooves formed in the second and third conductive layer spacers.

2. A method in accordance with claim 1, wherein the first, second and third conductive layers are formed of polysilicon.

3. A method in accordance with claim 1, wherein the first and third sacrificial films are formed of tetraethylorthosilicate.

4. A method in accordance with claim 1, wherein the second sacrificial film is formed of O₃-phospho silicate glass.

5. A method in accordance with claim 1, wherein the second sacrificial film is formed by lateral etch using buffered oxide etchant of 50:1.

6. A method in accordance with claim 1, wherein the first, second and third sacrificial films and the oxide film spacer are removed by using buffered oxide etchant of 9:1.

* * * * *